US010251270B2

(12) United States Patent
Xiong

(10) Patent No.: US 10,251,270 B2
(45) Date of Patent: Apr. 2, 2019

(54) DUAL-DRILL PRINTED CIRCUIT BOARD VIA

(71) Applicant: Innovium, Inc., San Jose, CA (US)

(72) Inventor: Yongming Xiong, Fremont, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 15/266,734

(22) Filed: Sep. 15, 2016

(65) Prior Publication Data

US 2018/0077800 A1     Mar. 15, 2018

(51) Int. Cl.
| H05K 1/11 | (2006.01) |
|---|---|
| H05K 3/40 | (2006.01) |
| H05K 1/18 | (2006.01) |
| H05K 1/02 | (2006.01) |
| H05K 3/00 | (2006.01) |

(52) U.S. Cl.
CPC ........... H05K 1/115 (2013.01); H05K 1/0228 (2013.01); H05K 1/0245 (2013.01); H05K 1/0251 (2013.01); H05K 3/4038 (2013.01); H05K 1/181 (2013.01); H05K 3/0047 (2013.01); H05K 2201/09636 (2013.01); H05K 2201/09727 (2013.01); H05K 2201/09827 (2013.01); H05K 2201/09854 (2013.01); H05K 2201/10545 (2013.01); H05K 2203/0207 (2013.01)

(58) Field of Classification Search
CPC ...................................................... H05K 1/181
USPC ....................................................... 361/760
See application file for complete search history.

(56) References Cited

U.S. PATENT DOCUMENTS

| 5,038,252 A * | 8/1991 | Johnson | H05K 1/0263 174/251 |
|---|---|---|---|
| 5,290,970 A * | 3/1994 | Currie | H05K 3/225 174/250 |
| 5,406,034 A * | 4/1995 | Frei | H05K 1/115 174/262 |
| 5,453,403 A * | 9/1995 | Meng | H01L 21/76804 257/E21.578 |
| 5,487,218 A * | 1/1996 | Bhatt | H01L 23/5384 174/262 |

(Continued)

FOREIGN PATENT DOCUMENTS

| CN | 201709040 | 1/2011 |
|---|---|---|
| CN | 103458627 | 12/2013 |
| TW | 201503775 | 1/2015 |

OTHER PUBLICATIONS

Taiwanese Office Action issued in Taiwanese Application No. 106118356, dated Jun. 20, 2018, 35 pages (with English translation).

*Primary Examiner* — Dimary S Lopez Cruz
*Assistant Examiner* — Muhammed Azam
(74) *Attorney, Agent, or Firm* — Fish & Richardson P.C.

(57) ABSTRACT

A printed circuit board having multiple layers of circuitry, the printed circuit board including a first layer having a first cylindrical opening with a first diameter, the first cylindrical opening formed through at least the first layer and formed about a particular axis; and a second layer having a second cylindrical opening with a second diameter, the second cylindrical opening formed through at least the second layer and formed about the particular axis, where the first cylindrical opening is a portion of a conductive via, and where the second diameter is smaller than the first diameter.

15 Claims, 7 Drawing Sheets

(56) References Cited

U.S. PATENT DOCUMENTS

| | | | | |
|---|---|---|---|---|
| 5,736,679 A * | 4/1998 | Kresge | | H05K 1/0271 174/250 |
| 5,982,256 A * | 11/1999 | Uchimura | | H01P 1/047 333/239 |
| 6,175,087 B1 * | 1/2001 | Keesler | | H05K 3/429 174/261 |
| 6,181,219 B1 * | 1/2001 | Gailus | | H05K 1/024 174/262 |
| 6,240,636 B1 * | 6/2001 | Asai | | H05K 3/0038 205/126 |
| 6,369,336 B1 * | 4/2002 | Obata | | H01R 12/714 174/266 |
| 6,518,670 B1 * | 2/2003 | Mandelman | | H01L 21/76897 257/750 |
| 6,541,712 B1 * | 4/2003 | Gately | | H05K 1/115 174/258 |
| 6,590,165 B1 * | 7/2003 | Takada | | H01L 21/486 174/260 |
| 6,713,685 B1 * | 3/2004 | Cotton | | H05K 1/0218 174/262 |
| 7,155,821 B1 * | 1/2007 | Downes | | H05K 1/112 29/825 |
| 7,301,775 B2 * | 11/2007 | Isoda | | H01L 23/50 257/E23.079 |
| 7,911,026 B2 * | 3/2011 | Binder | | H01L 23/49827 257/211 |
| 8,102,057 B2 * | 1/2012 | Leon | | H05K 1/115 174/263 |
| 8,302,301 B2 * | 11/2012 | Lau | | H05K 1/0251 174/262 |
| 8,923,007 B2 * | 12/2014 | Sweeney | | H05K 3/3447 174/262 |
| 9,545,003 B2 * | 1/2017 | Rengarajan | | H05K 1/0222 |
| 9,867,290 B2 * | 1/2018 | Pen | | H05K 1/115 |
| 2001/0020548 A1 * | 9/2001 | Burgess | | B23K 26/0853 174/262 |
| 2002/0066179 A1 * | 6/2002 | Hall | | H05K 3/4069 29/852 |
| 2002/0075096 A1 * | 6/2002 | Anthony | | H01G 4/012 333/167 |
| 2002/0125044 A1 * | 9/2002 | Johnson | | H01L 23/49822 174/262 |
| 2003/0151485 A1 * | 8/2003 | Lewis | | H01L 23/645 336/200 |
| 2004/0118605 A1 * | 6/2004 | van der Laan | | H05K 3/429 174/262 |
| 2004/0163234 A1 * | 8/2004 | Provo | | H01C 1/16 29/620 |
| 2005/0067711 A1 * | 3/2005 | Opheim | | H01L 21/76898 257/774 |
| 2005/0128672 A1 * | 6/2005 | Tourne | | H05K 3/0047 361/119 |
| 2006/0046481 A1 * | 3/2006 | Tokuda | | H05K 3/187 438/687 |
| 2006/0175085 A1 * | 8/2006 | Lin | | H05K 3/0094 174/262 |
| 2006/0226537 A1 * | 10/2006 | Okabe | | H01L 21/486 257/700 |
| 2006/0289202 A1 * | 12/2006 | Takeuchi | | H01L 23/49827 174/262 |
| 2007/0045000 A1 * | 3/2007 | Lin | | H05K 1/024 174/264 |
| 2007/0136618 A1 * | 6/2007 | Ohsaka | | G06F 1/188 713/323 |
| 2007/0249209 A1 * | 10/2007 | Djordjevic | | G11C 5/063 439/320 |
| 2007/0266559 A1 * | 11/2007 | Lee | | H05K 3/4652 29/852 |
| 2007/0269588 A1 * | 11/2007 | Lee | | H05K 3/0035 427/97.2 |
| 2008/0121422 A1 * | 5/2008 | Karasawa | | H05K 1/115 174/262 |
| 2008/0250377 A1 * | 10/2008 | Bird | | G01R 31/2818 716/137 |
| 2008/0250637 A1 * | 10/2008 | Zhang | | H05K 3/4635 29/852 |
| 2008/0257596 A1 * | 10/2008 | Kaneko | | H01L 21/4857 174/264 |
| 2009/0045889 A1 * | 2/2009 | Goergen | | H05K 1/0216 333/175 |
| 2009/0166080 A1 * | 7/2009 | Matsui | | H05K 3/4623 174/266 |
| 2009/0200682 A1 * | 8/2009 | Zhang | | H01L 21/486 257/774 |
| 2010/0061068 A1 * | 3/2010 | Geissler | | H05K 1/18 361/759 |
| 2010/0307809 A1 * | 12/2010 | Noda | | H05K 1/115 174/266 |
| 2010/0319979 A1 * | 12/2010 | Hsu | | H05K 1/0251 174/262 |
| 2011/0180306 A1 * | 7/2011 | Naganuma | | H05K 1/115 174/254 |
| 2011/0180930 A1 * | 7/2011 | Arai | | H01L 23/147 257/773 |
| 2012/0080222 A1 * | 4/2012 | Kim | | H05K 1/0231 174/260 |
| 2012/0193782 A1 * | 8/2012 | Akamatsu | | H01L 23/481 257/737 |
| 2012/0199386 A1 * | 8/2012 | Adachi | | H05K 3/445 174/258 |
| 2012/0234580 A1 * | 9/2012 | Niman | | H05K 1/0251 174/251 |
| 2012/0279774 A1 * | 11/2012 | Niman | | H05K 1/0251 174/262 |
| 2013/0175077 A1 * | 7/2013 | Kim | | H05K 1/0222 174/262 |
| 2013/0277097 A1 * | 10/2013 | Maeng | | H05K 1/09 174/257 |
| 2014/0001150 A1 * | 1/2014 | Lecesse | | H05K 3/429 216/18 |
| 2014/0085034 A1 * | 3/2014 | Perez-Uria | | H05K 1/0206 336/200 |
| 2014/0182915 A1 * | 7/2014 | Han | | H05K 3/0017 174/262 |
| 2015/0047188 A1 * | 2/2015 | Thomas | | H05K 3/427 29/852 |
| 2015/0075848 A1 * | 3/2015 | Naganuma | | H05K 3/4623 174/255 |
| 2015/0076677 A1 * | 3/2015 | Ebefors | | H01L 23/49811 257/676 |
| 2015/0208514 A1 * | 7/2015 | Thomas | | H05K 3/429 205/125 |
| 2015/0245486 A1 * | 8/2015 | Shin | | H05K 1/0298 361/760 |
| 2015/0357276 A1 * | 12/2015 | Shimizu | | H01L 23/49838 361/783 |
| 2016/0057853 A1 * | 2/2016 | Zacharko | | H05K 1/0265 166/66 |
| 2017/0086289 A1 * | 3/2017 | Takahashi | | H02M 1/14 |
| 2017/0196084 A1 * | 7/2017 | Ishihara | | H05K 1/115 |
| 2017/0214377 A1 * | 7/2017 | Ridder | | H03H 1/0007 |
| 2017/0231099 A1 * | 8/2017 | Mundt | | H05K 3/4084 |
| 2017/0278787 A1 * | 9/2017 | Uzoh | | H01L 28/60 |

\* cited by examiner

DUAL-DRILL PRINTED CIRCUIT BOARD VIA

BACKGROUND

This specification relates to forming an electrical connection on a printed circuit board through a via.

SUMMARY

An assembly, where two components are pressed to opposite sides of the printed circuit board (PCB) for establishing electrical connections with the PCB, may be used to provide a compact form factor. Circuitry on such an assembly may be used in transferring data in data networks, data centers, and many other suitable applications. Conventionally, one-size through-hole vias are formed in a PCB to enable physical and electrical connections with contact pins of external components. However, it is difficult to route differential pair traces between a signal via and a ground via while meeting PCB manufacturing requirements such as drill-to-metal or backdrill-to-metal constraints. In addition, because the one-size through-hole vias usually have a large diameter, a trace of a differential pair traces typically has to be routed separately on the PCB from the other trace in order to connect to the respective vias in the pin area, which may create phase errors between the differential pair traces or an impedance mismatch. Moreover, high speed signals of the component placed on the top layer of a PCB and high speed signals of the component placed on the bottom layer of the PCB create crosstalk because of the proximity of vias to each other. Conventionally, to reduce the crosstalk, PCB thickness has to be increased such that the signal pins in the adjacent vias are far enough from each other vertically, which affects the cost of the PCB. According to one innovative aspect of the subject matter described in this specification, dual-drill vias are formed in a PCB, where each via includes a wide cylindrical opening formed on one side of a PCB and a narrow cylindrical opening formed on the opposite side of a PCB at the same corresponding location as the wide cylindrical opening. In other words, the wide cylindrical opening and the narrow cylindrical opening share the same axis. The second, smaller cylindrical opening enables improved manufacturability, improved signal integrity, and a reduction of crosstalk between adjacent vias.

In general, one innovative aspect of the subject matter described in this specification can be embodied in a printed circuit board having multiple layers of circuitry, the printed circuit board including a first layer having a first cylindrical opening with a first diameter, the first cylindrical opening formed through at least the first layer and formed about a particular axis; and a second layer having a second cylindrical opening with a second diameter, the second cylindrical opening formed through at least the second layer and formed about the particular axis, where the first cylindrical opening is a portion of a conductive via, and where the second diameter is smaller than the first diameter.

This and other implementations can each optionally include one or more of the following features. The printed circuit board may include a third layer having a third cylindrical opening with a third diameter, the third cylindrical opening formed through at least the third layer and formed about the particular axis, where the third layer is arranged between the first layer and the second layer, where the third diameter is smaller than the second diameter, where the third cylindrical opening is a portion of the conductive via, and where the second cylindrical opening is non-conductive.

The second cylindrical opening may be a portion of the conductive via. The first layer may have a third cylindrical opening with the second diameter, the third cylindrical opening formed through at least the first layer and formed about a different axis that is parallel to the particular axis. The second layer may have a fourth cylindrical opening with the first diameter, the fourth cylindrical opening formed through at least the second layer and formed about the different axis. The fourth cylindrical opening may be a portion of a different conductive via.

The first layer may include a pair of conductive traces, where a first conductive trace of the pair of conductive traces is electrically coupled to the conductive via, and where a sum of (i) one half of the first diameter, (ii) one half of the second diameter, (iii) a distance between a cylindrical opening with the first diameter and the first conductive trace of the pair of conductive traces, (iv) a distance between a cylindrical opening with the second diameter and a second conductive trace of the pair of conductive traces, and (v) a distance between the first conductive trace and the second conductive trace, may satisfy a predetermined threshold. The second layer may include a different pair of conductive traces, and a first conductive trace of the different pair of conductive traces may be electrically coupled to the different conductive via. The third cylindrical opening may be a portion of the different conductive via.

The printed circuit board may include a third layer having a fifth cylindrical opening with a third diameter, the fifth cylindrical opening formed through at least the third layer and formed about the particular axis; a fourth layer having a sixth cylindrical opening with the third diameter, the sixth cylindrical opening formed through at least the fourth layer and formed about the different axis, where the third layer and the fourth layer are arranged between the first layer and the second layer, where the third diameter is smaller than the second diameter, where the fifth cylindrical opening is a portion of the conductive via, where the sixth cylindrical opening is a portion of the different conductive via, and where the second cylindrical opening and the third cylindrical opening are non-conductive.

The first layer and the second layer may have a third cylindrical opening with the first diameter, the third cylindrical opening formed through at least the first layer and the second layer formed about a different axis that is parallel to the particular axis. The third cylindrical opening may be a portion of a ground via coupled to a ground voltage.

Another innovative aspect of the subject matter described in this specification can be embodied in an apparatus including a printed circuit board having multiple layers of circuitry, the printed circuit board including a first layer having a first cylindrical opening with a first diameter, the first cylindrical opening formed through at least the first layer and formed about a particular axis; and a second layer having a second cylindrical opening with a second diameter, the second cylindrical opening formed through at least the second layer and formed about the particular axis, where the first cylindrical opening is a portion of a conductive via, and where the second diameter is smaller than the first diameter; and a first component having multiple pins, where a first pin of the multiple pins is connected to the conductive via.

This and other implementations can each optionally include one or more of the following features. The apparatus may include a second component having multiple pins, where the printed circuit board is arranged between the first component and the second component, where the first layer of the printed circuit board has a third cylindrical opening with the second diameter, the third cylindrical opening formed through at least the first layer and formed about a different axis that is parallel to the particular axis, where the second layer of the printed circuit board has a fourth cylindrical opening with the first diameter, the fourth cylindrical opening formed through at least the second layer and formed about the different axis, where the fourth cylindrical opening is a portion of a different conductive via of the printed circuit board, and where a first pin of the multiple pins of the second component is connected to the different conductive via.

The first component may be a transmitter module for transmitting data and the second component may be a receiver module for receiving data. The first layer and the second layer may have a third cylindrical opening with the first diameter, the third cylindrical opening being a portion of a ground via that is coupled to a ground voltage. A second pin of the multiple pins of the first component may be connected to the ground via through the first layer, and a second pin of the multiple pins of the second component may be connected to the ground via through the second layer.

The printed circuit board may further include a third layer having a fifth cylindrical opening with a third diameter, the fifth cylindrical opening formed through at least the third layer and formed about the particular axis; and a fourth layer having a sixth cylindrical opening with the third diameter, the sixth cylindrical opening formed through at least the fourth layer and formed about the different axis, where the third layer and the fourth layer are arranged between the first layer and the second layer, where the third diameter is smaller than the second diameter, where the fifth cylindrical opening is a portion of the conductive via, where the sixth cylindrical opening is a portion of the different conductive via, and where the second cylindrical opening and the third cylindrical opening are non-conductive.

The second cylindrical opening may be a portion of the conductive via, and the third cylindrical opening may be a portion of the different conductive via. The first layer may include a pair of conductive traces, where a first conductive trace of the pair of conductive traces may be electrically coupled to the conductive via, and where a sum of (i) one half of the first diameter, (ii) one half of the second diameter, (iii) a distance between a cylindrical opening with the first diameter and the first conductive trace of the pair of conductive traces, (iv) a distance between a cylindrical opening with the second diameter and a second conductive trace of the pair of conductive traces, and (v) a distance between the first conductive trace and the second conductive trace, may satisfy a predetermined threshold.

Another innovative aspect of the subject matter described in this specification can be embodied in a method of forming vias on a printed circuit board having multiple layers of circuitry, including forming, about a particular axis, a first cylindrical opening with a first diameter through at least a first layer of the printed circuit board; and forming, about the particular axis, a second cylindrical opening with a second diameter through at least a second layer of the printed circuit board, where the first cylindrical opening and the second cylindrical opening are portions of a conductive via, and where the second diameter is smaller than the first diameter.

This and other implementations can each optionally include one or more of the following features. To form the second cylindrical opening, a cylindrical opening may be drilled using a drill bit having the second diameter through the first layer followed by the second layer. To form the first cylindrical opening, after forming the cylindrical opening with the second diameter through the first layer and the second layer, the first cylindrical opening may be drilled through at least the first layer using a drill bit having the first diameter.

To form the first cylindrical opening, the first cylindrical opening may be drilled through at least the first layer of the printed circuit board in a first direction along the particular axis. To form the second cylindrical opening, the second cylindrical opening may be drilled through at least the second layer of the printed circuit board in a second direction along the particular axis that is opposite to the first direction.

The second cylindrical opening may be formed through at least a third layer of the printed circuit board that is between the first layer and the second layer. After forming the second cylindrical opening, a third cylindrical opening with a third diameter may be formed through at least the second layer of the printed circuit board in the second direction along the particular axis, where the second diameter is smaller than the third diameter.

The subject matter described in this specification can be implemented in particular embodiments so as to realize one or more of the following advantages. In belly-to-belly press-fit applications or in clam-shelled through-hole component applications, crosstalk between high speed signals of a component placed on a top layer of the PCB and high speed signals of a component placed on a bottom layer of the PCB may be reduced, improving the signal integrity of the transferred data. The additional cost of dual-drill vias is minimal. PCB manufacturability and yield may be improved due to more relaxed manufacturing constraints. Differential pair routing channels may be widened to reduce signal loss, maintain differential pair signal integrity, reduce impedance mismatch, and reduce signal loss.

The details of one or more implementations are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
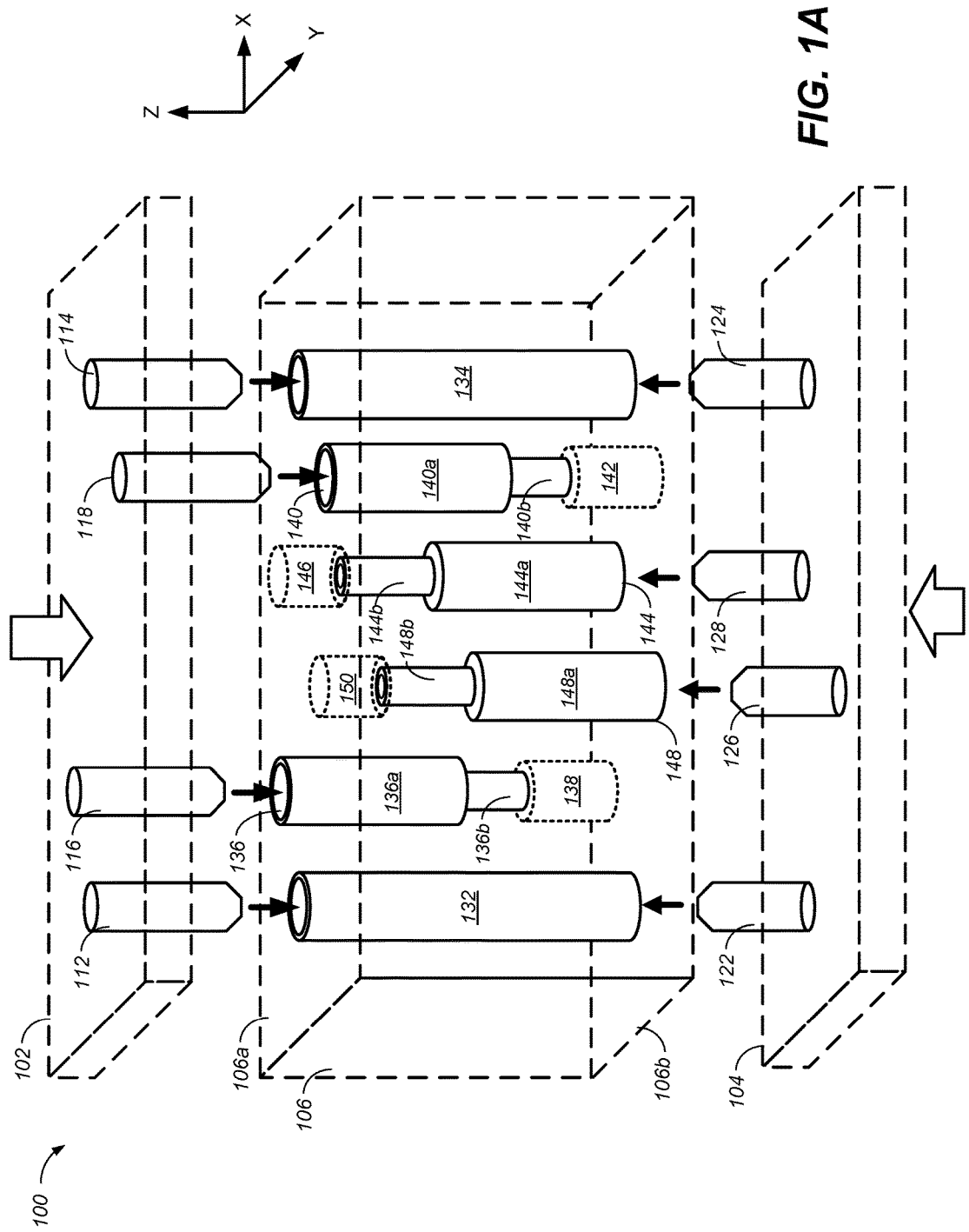
FIGS. 1A and 1B illustrate examples of a printed circuit board having dual-drill vias for a belly-to-belly assembly.

FIG. 1A illustrates an example assembly 100 that includes a printed circuit board (PCB) 106, a first component 102, and a second component 104. In general, the assembly 100 may be any suitable packaged device or a part of a device or a part of a system that support a belly-to-belly configuration. For example, the assembly 100 may be a zQSFP+ (zQuad Small Form-Factor Pluggable Plus) connector or a QSFP28 connector that enables electrical or optical data communications in a network system. In a belly-to-belly configuration, the first component 102 and the second component 104 are pressed against the surface 106a and 106b of the PCB 106 respectively to establish an electrical connection with the PCB 106. The first component 102 and the second component 104 may be pressed against the surface 106a and 106b of the PCB 106 through a press-fit package scheme, a clam-shell package scheme, or any other suitable scheme.

The first component 102 includes circuitry for one or more specific functions. For example, the first component 102 may be a transmitter that generates, modulates, and outputs multi-channel signals. The first component 102 includes pins 112, 114, 116, and 118 for establishing electrical connections with the PCB 106. The second component 104 includes circuitry for one or more specific functions. For example, the second component 104 may be a receiver that receives and detects multi-channel signals from an external data path. The second component 104 includes pins 122, 124, 126, and 128 for establishing electrical connections with the PCB 106.

Figure 1B:
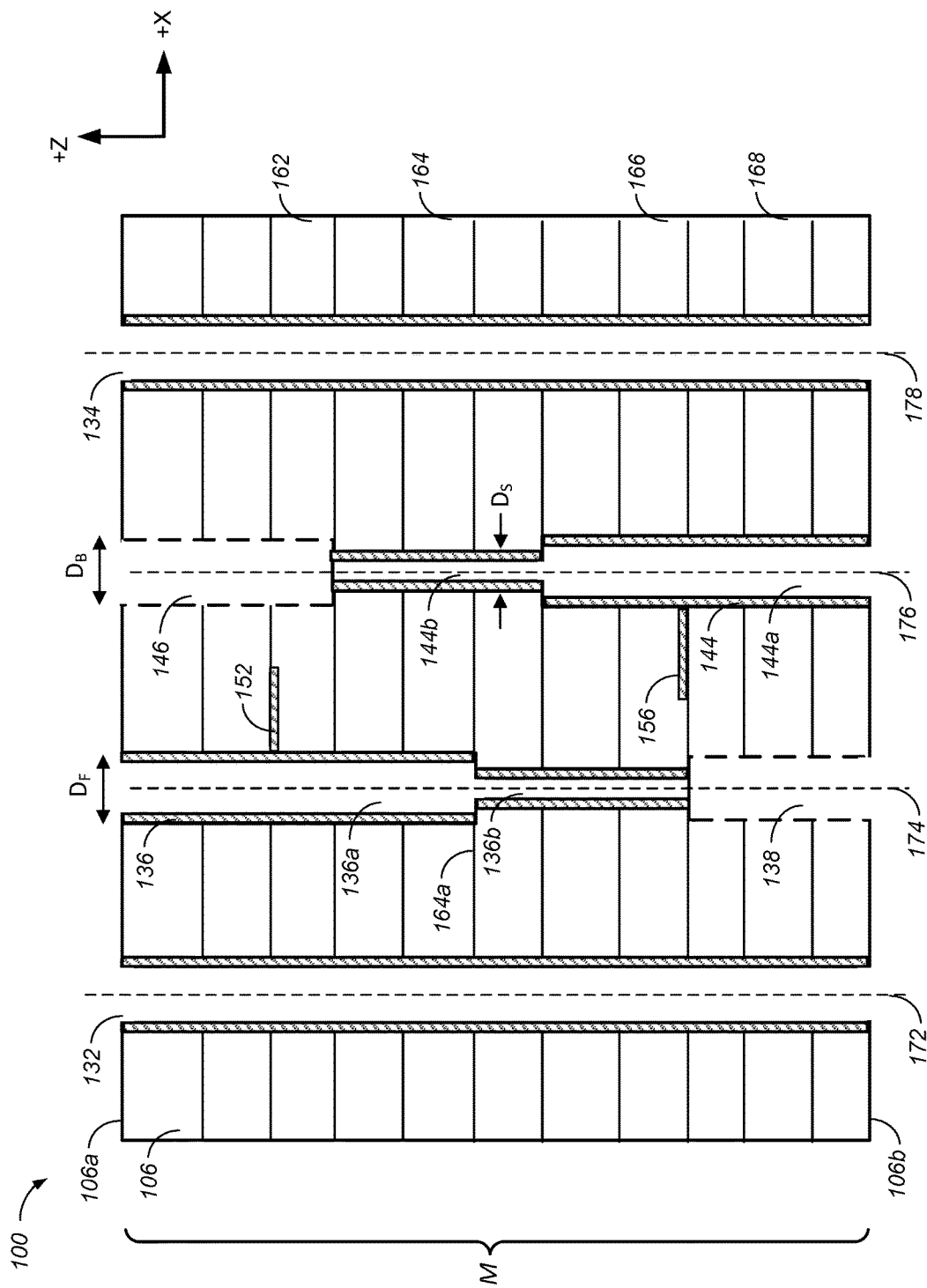

The PCB 106 includes multiple layers of circuitry. For example, as illustrated in FIG. 1B, the PCB 106 may include M layers of circuitry, including layers 162, 164, 166, and 168, where M is any positive integer. Each layer may include circuitry for one or more specific functions. For example, the layer 162 may include a conductive trace 152 that provides high-speed electrical signals to the first component 102 through a via 136. As another example, the layer 166 may include a conductive trace 156 that provides a DC electrical signal to the second component 104 through a via 144. Although not shown in FIG. 1B, circuitry from any suitable layer of the PCB 106 may be connected to either the first component 102 or the second component 104 through one or more vias based on designs and applications.

Referring back to FIG. 1A, the PCB 106 includes vias 132, 134, 136, 140, 144, and 148. In general, the pins 112, 114, 116, and 118 are inserted into vias 132, 134, 136, and 140, respectively, to establish electrical connections between the first component 102 and the PCB 106. Similarly, the pins 122, 124, 126, and 128 are inserted into vias 132, 134, 148, and 144, respectively, to establish electrical connections between the second component 104 and the PCB 106.

In this example, the vias 132 and 134 are ground vias that are electrically coupled to a reference voltage, in this example, ground. The first component 102 and the second component 104 share the ground vias 132 and 134. Referring to FIG. 1B, the ground via 132 is a through hole via having a cylindrical opening, which is formed about an axis 172 with a diameter of $D_F$. The diameter $D_F$ may be any value that is suitable for a design, an application, and manufacturability. For example, the diameter $D_F$ may be 18 mil or any other suitable value that a drill bit may provide. Similarly, the ground via 134 is a through hole via having a cylindrical opening, which is formed about an axis 178 with a diameter of $D_F$. A conductive film having a predetermined thickness is deposited on the surfaces of ground vias 132 and 134 using any suitable process such as electroplating.

In this example, the vias 136 and 140 are dual-drill vias that provide electrical signals to the first component 102. Referring to FIG. 1B, the via 136 includes a wide cylindrical opening 136a and a narrow cylindrical opening 136b, where the two cylindrical openings 136a and 136b are electrically connected. The cylindrical openings 136a and 136b are formed about an axis 174. The wide cylindrical opening 136a has a diameter of $D_F$, and the narrow cylindrical opening 136b has a diameter of $D_S$ that is smaller than $D_F$. The diameter $D_S$ may be any value that is suitable for a design, an application, and manufacturability. For example, the diameter $D_S$ may be 8 mil or any other suitable value that a drill bit may provide. A conductive film having a predetermined thickness is deposited on the surfaces of the cylindrical openings 136a and 136b using any suitable process such as electroplating.

In this example, a non-conductive hole 138 extends from the narrow cylindrical opening 136b to the surface 106b of the PCB. This hole may be formed by removing a portion of the narrow cylindrical opening 136b of the via 136 and may be referred to as a back-drilled hole. The non-conductive back-drilled hole 138 eliminates an unused portion of the narrow cylindrical opening 136b, which reduces signal reflection induced within the dual-drill via 136. The unused portion of the narrow cylindrical opening 136b may be referred to as a via stub. The back-drilled hole 138 may have a cylindrical opening that is formed about the axis 174 with a diameter of $D_B$. In general, the diameter $D_B$ is larger than $D_S$, and may be selected based on different designs, applications, and manufacturability. For example, the diameter $D_B$ may be 16 mil or any other suitable value that a drill bit may provide.

In the example of FIG. 1A, the via 140 includes a wide cylindrical opening 140a and a narrow cylindrical opening 140b that are electrically connected to each other. The cylindrical openings 140a and 140b are formed about an axis that is not shown in FIG. 1A. The wide cylindrical opening 140a may have a diameter of $D_F$, and the narrow cylindrical opening 140b may have a diameter of $D_S$. In some implementations, a back-drilled hole 142 may be formed by removing a portion of the narrow cylindrical opening 140b of the via 140, i.e., the via stub.

Similarly, the vias 144 and 148 are dual-drill vias that provide electrical signals to the second component 104. Referring to FIG. 1B, the via 144 includes a wide cylindrical opening 144a and a narrow cylindrical opening 144b that are electrically connected to each other. The cylindrical openings 144a and 144b are formed about an axis 176. In some implementations, the wide cylindrical opening 144a has a diameter of $D_F$, and the narrow cylindrical opening 144b has a diameter of $D_S$. A conductive film having a predetermined thickness may be deposited on the surfaces of the cylindrical openings 144a and 144b. In some implementations, a back-drilled hole 146 may be formed by removing a portion of the narrow cylindrical opening 144b of the via 144. The back-drilled hole 144 may have a cylindrical opening that is formed about the axis 176 with a diameter of $D_B$.

In the example of FIG. 1A, the via 148 includes a wide cylindrical opening 148a and a narrow cylindrical opening 148b, where the two cylindrical openings 148a and 148b are electrically connected. The cylindrical openings 148a and 148b are formed about an axis that is not shown in FIG. 1A. The wide cylindrical opening 148a may have a diameter of $D_F$, and the narrow cylindrical opening 148b may have a diameter of $D_B$. In some implementations, a back-drilled hole 150 may be formed by removing a portion of the narrow cylindrical opening 148b of the via 148, i.e., the via stub.

Parameters such as the diameters and depths of a ground via, the wide cylindrical opening of a dual-drill via, the narrow cylindrical opening of a dual-drill, and a back-drilled hole may vary depending on designs, applications, and/or manufacturing constraints. For example, the depths of back-drilled holes may be constant for one application, but may vary for another application. As another example, the depths of dual-drill vias may be one value for the dual-drill vias connected to the first component 102, and may be a different value for the dual-drill vias connected to the second component 104.

Dual-drill vias may provide improved signal integrity and reduce crosstalk for a signal that travels through the PCB 106. For example, due to the smaller diameter of the narrow cylindrical opening of a dual-drill via, a distance between a data path, e.g., the wide cylindrical opening 136a of the dual-drill via 136, and an interference source, e.g., the narrow cylindrical opening 144b of the dual-drill via 144 or the back-drilled hole 146, is increased in a dual-drill via configuration when compared with a distance between a data path and an interference source in a conventional one-size through-hole via configuration. Since the distance for interference is increased, the crosstalk may be reduced and the signal integrity may be improved. In addition, dual-drill vias may improve manufacturability and yield of the PCB 106. For example, due to the smaller diameter of the narrow cylindrical opening of a dual-drill via, the diameter of the back-drill bit for forming the back-drilled holes may be reduced. With a smaller back-drill bit, it is less likely that the back-drilled holes will damage adjacent dual-drill vias, PCB traces, or pads, thereby improving the manufacturability and yield of the PCB 106.

Although not shown in FIG. 1A and FIG. 1B, additional vias may be formed in the PCB 106 at suitable locations based on designs and applications. Moreover, although the wide cylindrical opening and the narrow cylindrical opening of a dual-drill via are described as being formed about the same axis, an offset between the wide cylindrical opening and the narrow cylindrical opening may be introduced due to variability or tolerance in a manufacturing process or for some other reason. The variability or tolerance of the offset may be characterized through statistical techniques, and the descriptions in this specification related to the wide cylindrical opening and the narrow cylindrical opening of a dual-drill via being formed about the same axis would encompass cases where an offset is introduced between the wide cylindrical opening and the narrow cylindrical opening. Similarly, although the dual-drill via and the back-drilled hole are described as being formed about the same axis, an offset between the dual-drill via and back-drilled hole also may be introduced. The variability or tolerance of the offset may be characterized through statistical techniques, and the descriptions in this specification related to the dual-drill via and the back-drilled hole being formed about the same axis would encompass cases where an offset is introduced between the dual-drill via and a back-drilled hole. Moreover, although not shown in FIG. 1A and FIG. 1B, it is not required that an end of a wide cylindrical opening or an end of a narrow cylindrical opening be on the same plane as a surface of a PCB layer. For example, it is not required that the end of the wide cylindrical opening 136a be formed on the same plane as a bottom surface 164a of the PCB layer 164. The wide cylindrical opening 136a may be drilled to stop within the PCB layer 164, and the narrow cylindrical opening 136b may be drilled to connect with the wide cylindrical opening 136a, where the end of the wide cylindrical opening 136a and the end of the narrow cylindrical opening 136b would meet on a plane inside the PCB layer 164 that is not the surface 164a of the PCB layer 164.

Figure 2:
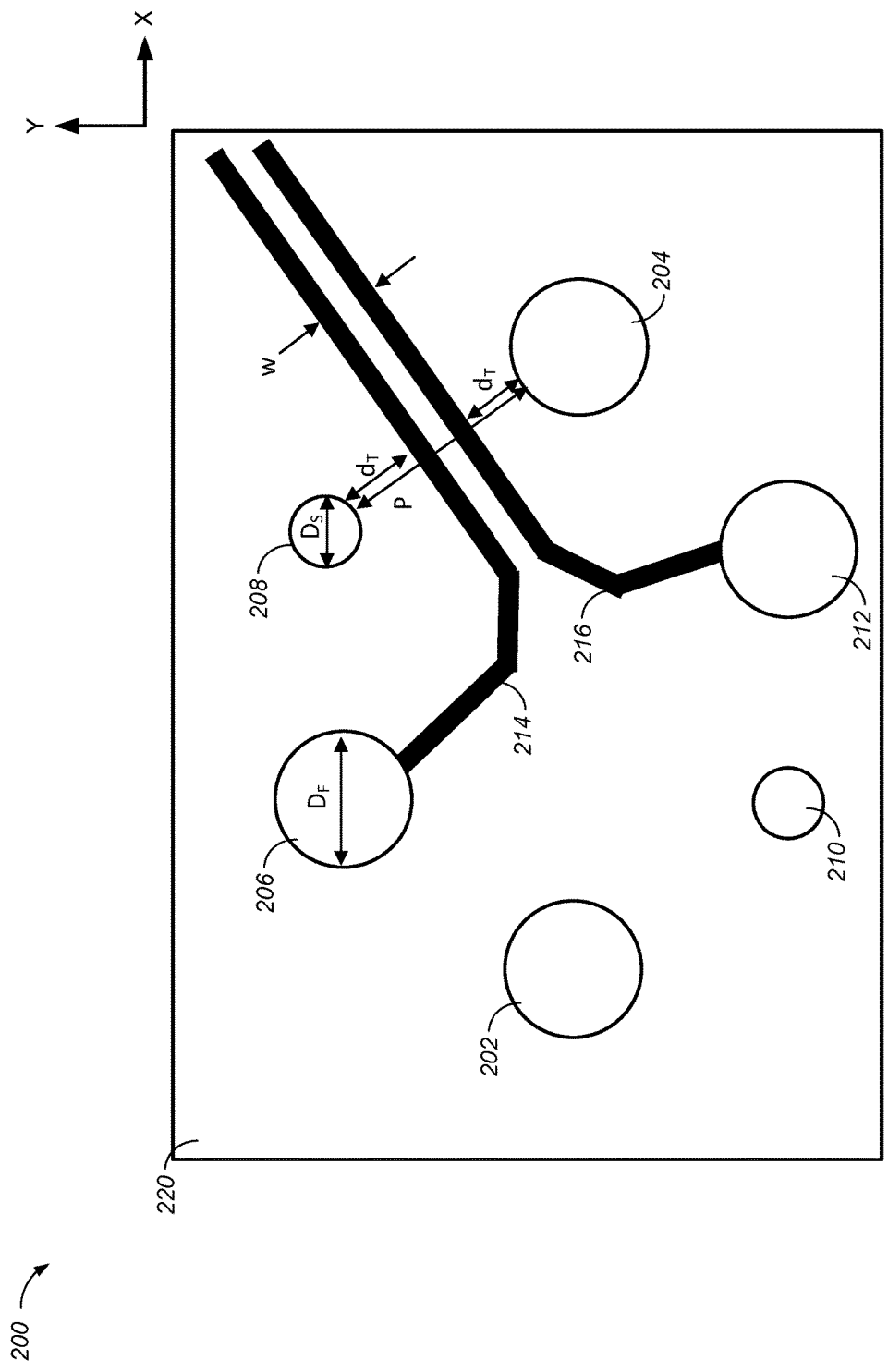
FIG. 2 illustrates an example printed circuit board layer having dual-drill vias.

FIG. 2 illustrates an example PCB layer 200. In general, circuitry including dual-drill vias and conductive traces are formed on a substrate 220 of the PCB layer 200. The PCB layer 200 may be one of the PCB layers in the PCB 106 as described in reference to FIG. 1A and FIG. 1B, for example.

The PCB layer 200 includes ground vias 202 and 204 that are electrically coupled to a ground voltage, dual-drill vias 206 and 212 that are connected to a first component, dual-drill vias 208 and 210 that connect to a second component, and conductive traces 214 and 216. The ground vias 202 and 204 are similar to the ground vias 132 and 134 as described in reference to FIG. 1A and FIG. 1B. The dual-drill vias 206 and 212 are similar to the dual-drill vias 136 and 140 as described in reference to FIG. 1A and FIG. 1B, where a portion of the wide cylindrical openings are formed in the substrate 220. The dual-drill vias 208 and 210 are similar to the dual-drill vias 148 and 144 as described in reference to FIG. 1A and FIG. 1B, where a portion of the narrow cylindrical openings are formed in the substrate 220. The conductive traces 214 and 216 may be traces that route electrical signals from one connected element to another connected element. For example, the conductive traces 214 and 216 may be a differential pair that transfers high speed data to drive a modulator in the first component.

In high data rate applications, e.g., 100 Gbps transmission, it is important that the lengths of a differential pair, e.g., conductive traces 214 and 216, matched in length and kept the same space in order to maintain the signal integrity of the signals being transmitted on the differential pair. One way to maintain equal lengths of the conductive traces 214 and 216 is to route the pair together on the PCB layer 200.

As described in reference to FIG. 1A and FIG. 1B, the ground vias 202 and 204 may have a diameter of $D_F$. The wide cylindrical opening of the dual-drill vias 206 and 212 may have a diameter of $D_F$, and the narrow cylindrical opening of the dual-drill vias 208 and 210 may have a diameter of $D_s$. In some implementations, design rules, such as PCB manufacturing rules of a particular PCB fabrication facility, may be applied to ensure the manufacturability and yield of the PCB layer 200. Design rules for an application may specify a minimum width of a conductive trace and a minimum separation distance between two conductive traces, where a sum of the minimum width of two conductive traces and the minimum separation distance between the two conductive traces may be denoted as $W_{min}$. Design rules for an application may further specify a minimum drill-to-trace distance, $d_T$, between the edge of a drilled hole, e.g., ground via 204 or dual-drill via 208, to the edge of a closest trace, e.g., conductive trace 216. Design rules for an application may further specify a pitch distance, P, between two vias, e.g., ground via 204 and dual-drill via 208. The available routing width, w, for placing the two conductive traces, may be determined based on this formula:

$$w = P - \frac{(D_F - D_s)}{2} - 2 \times d_T. \quad (1)$$

In general, the available routing width, w, needs to be greater than or equal to $W_{min}$. As an example, assuming the values for P, $D_F$, $D_s$, and $d_T$ are 42 mil, 18 mil, 8 mil, and 8 mil, respectively, the available width, w, for placing the two conductive traces would be 13 mil, which would be sufficient for a differential pair 4-3-4 routing scheme, i.e., a minimum trace width of 4 mil and a minimum separation distance of 3 mil between two traces. Without dual-drill vias, e.g., one-size through-hole vias only, the available width for placing the two conductive traces would only be 8 mil, as a result of replacing $D_s$ with $D_F$ in formula (1), which is insufficient for the differential pair 4-3-4 routing scheme. To fit the two conductive traces, the pitch distance, P, between two vias would need to be increased. Dual-drill vias therefore enable a denser placement of vias on a PCB layer. In situation where the pin pitch of a component is fixed, the two traces of a differential pair cannot be routed in parallel, and each trace of the differential pair needs to be routed separately, which may cause signal degradation for high speed applications. Dual-drill vias enable the traces of a differential pair to be routed in parallel, thereby improving signal integrity of the transmitted data.

Figure 3:
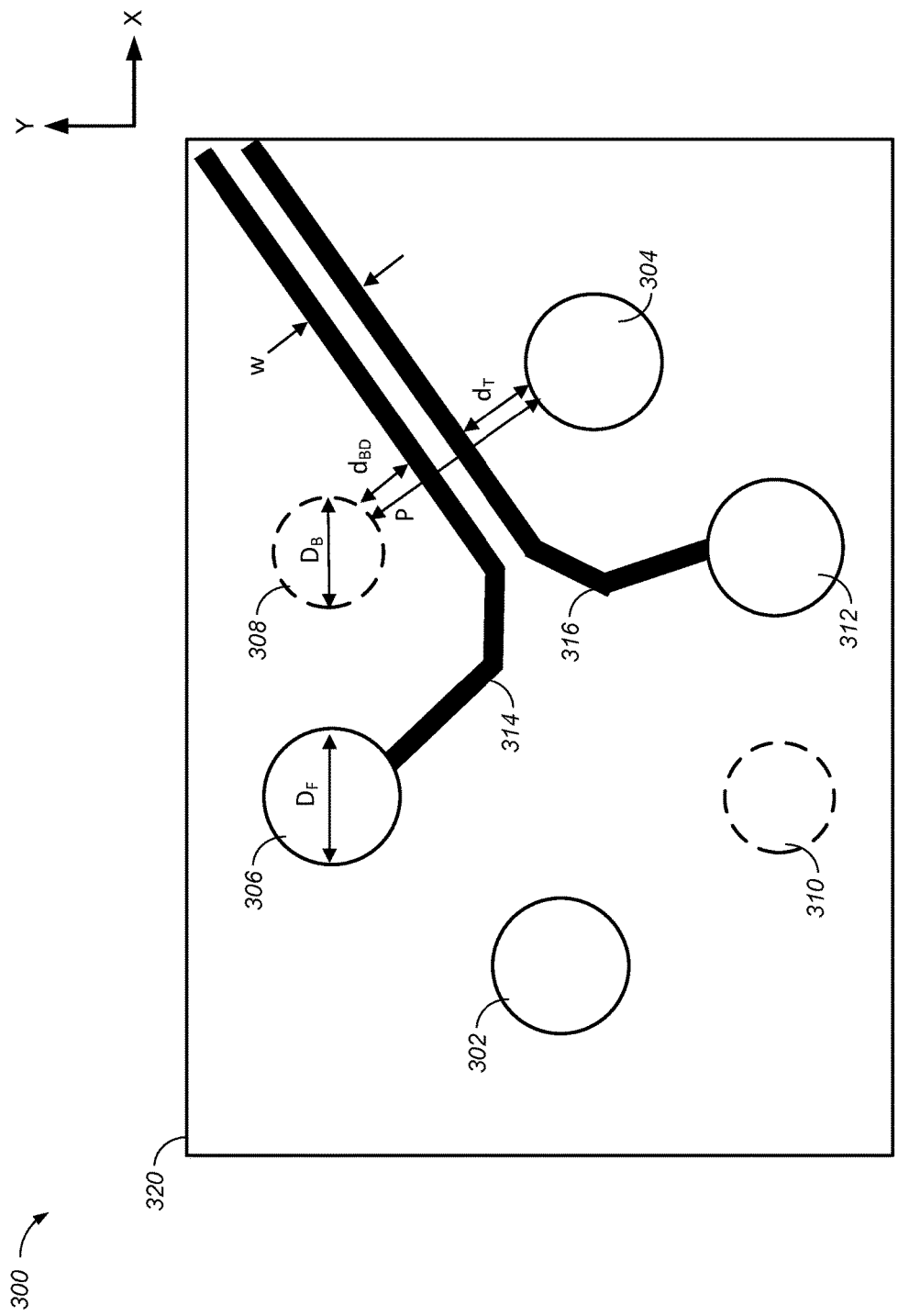
FIG. 3 illustrates an example printed circuit board layer having dual-drill vias with back-drilled holes.

FIG. 3 illustrates an example PCB layer 300. In general, circuitry including dual-drill vias, back-drilled holes, and conductive traces are formed in a substrate 320 of the PCB layer 300. The PCB layer 300 may be one of the PCB layers in the PCB 106 as described in reference to FIG. 1A and FIG. 1B, for example.

The PCB layer 300 includes ground vias 302 and 304 that are electrically coupled to a ground voltage, dual-drill vias 306 and 312 that are connected to a first component, back-drilled holes 308 and 310, and conductive traces 314 and 316. The ground vias 302 and 304 are similar to the ground vias 132 and 134 as described in reference to FIG. 1A and FIG. 1B, where a portion of the ground vias are formed in the substrate 320. The dual-drill vias 306 and 312 are similar to the dual-drill vias 136 and 140 as described in reference to FIG. 1A and FIG. 1B, where a portion of the wide cylindrical openings are formed in the substrate 320. The back-drilled holes 308 and 310 are similar to the back-drilled holes 146 and 150 as described in reference to FIG. 1A and FIG. 1B, where a portion of the back-drilled holes are formed in the substrate 320. The conductive traces 314 and 316 are similar to the conductive traces 214 and 216 as described in reference to FIG. 2. For example, the conductive traces 314 and 316 may be a differential pair that transfer high speed data to drive a modulator in the first component.

As described in reference to FIG. 1A and FIG. 1B, the ground vias 302 and 304 may have a diameter of $D_F$. The wide cylindrical opening of the dual-drill vias 306 and 312 may have a diameter of $D_F$, and the back-drilled holes 308 and 310 may have a diameter of $D_B$. Design rules for an application may specify a minimum width of a conductive trace and a minimum separation distance between two conductive traces, where a sum of the minimum width of two conductive traces and the minimum separation distance between the two conductive traces may be denoted as $W_{min}$. Design rules for an application may further specify a minimum drill-to-trace distance, $d_T$, between the edge of a drilled hole (e.g., ground via 304) to the edge of a closest element (e.g., conductive trace 316). Design rules for an application may further specify a minimum back-drill-to-trace distance, $d_{BD}$, between the edge of a back-drilled hole (e.g., back-drilled hole 308) to the edge of a closest element (e.g., conductive trace 314). Design rules for an application may further specify a pitch distance, P, between two vias (e.g., ground via 304 and dual-drill via 308). The available routing width, w, for placing the two conductive traces, may be determined based on this formula:

$$w = P - \frac{(D_F - D_B)}{2} - d_T - d_{BD}. \quad (2)$$

In general, the available routing width, w, needs to be greater than or equal to $W_{min}$. As an example, assuming the values for P, $D_F$, $D_B$, $d_{BD}$, and $d_T$ are 42 mil, 18 mil, 16 mil, 8 mil, and 8 mil, respectively. The available width, w, for placing the two conductive traces would be 9 mil, which would be insufficient for a differential pair 4-3-4 routing scheme, but would be sufficient for a single-trace routing (e.g., a trace width of 4 mil). To fit the two conductive traces 314 and 316, the pitch distance, P, between the ground via 304 and the back-drilled hole 308 would need to be increased to at least 44 mil. Alternatively, the two conductive traces 314 and 316 may be routed separately.

Figure 4:
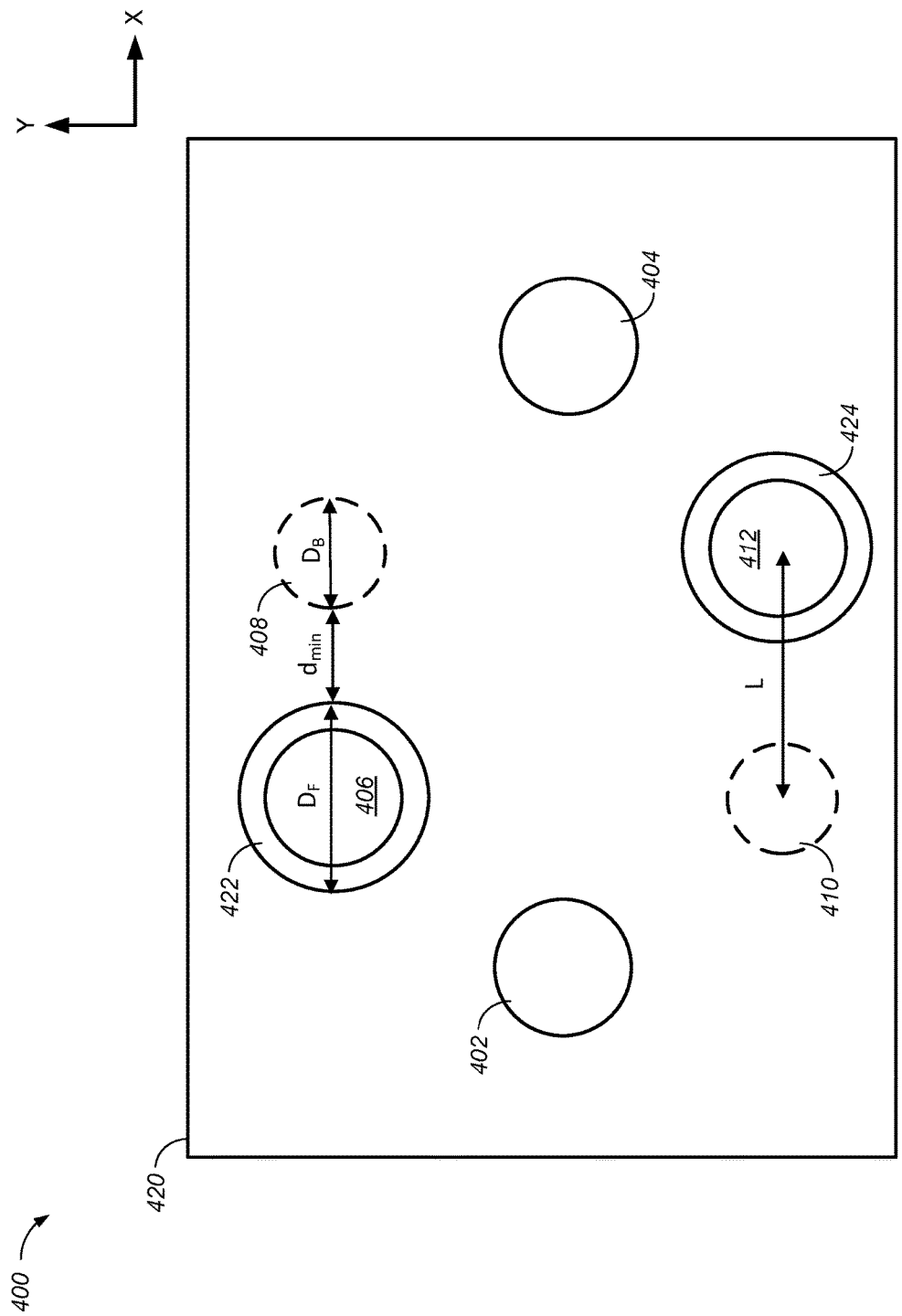
FIG. 4 illustrates an example printed circuit board layer having dual-drill vias with contact pads and back-drilled holes.

FIG. 4 illustrates an example PCB layer 400. In general, circuitry including dual-drill vias, back-drilled holes, contact pads, and conductive traces are formed on a substrate 420 of the PCB layer 400. The PCB layer 400 may be one of the PCB layers in the PCB 106 as described in reference to FIG. 1A and FIG. 1B, for example.

The PCB layer 400 includes ground vias 402 and 404 that are electrically coupled to a ground voltage, dual-drill vias 406 and 412 that are connected to a first component, back-drilled holes 408 and 410, conductive pads 422 and 424, and conductive traces 414 and 416. The ground vias 402 and 404 are similar to the ground vias 132 and 134 as described in reference to FIG. 1A and FIG. 1B, where a portion of the ground vias are formed in the substrate 420. The dual-drill vias 406 and 412 are similar to the dual-drill vias 136 and 140 as described in reference to FIG. 1A and FIG. 1B, where a portion of the wide cylindrical openings are formed in the substrate 420. The back-drilled holes 408 and 410 are similar to the back-drilled holes 146 and 150 as described in reference to FIG. 1A and FIG. 1B, where a portion of the back-drilled holes are formed in the substrate 320. The conductive pads 422 and 424 may be ring-shaped conductive pads; a conductive pad provides an electrical connection between a conductive trace on the same layer and a via.

As described in reference to FIG. 1A and FIG. 1B, the ground vias 402 and 404 may have a diameter of $D_F$. The dual-drill vias 406 and 412 may have a diameter of $D_F$, and the back-drilled holes 408 and 410 may have a diameter of $D_B$. Design rules for an application, such as PCB manufacturing rules of a particular PCB fabrication facility, may specify a minimum back-drill-to-element distance, $d_{min}$, between the edge of a back-drilled hole (e.g., back-drilled hole 308) to the edge of a closest element (e.g., conductive pad 422). Design rules for an application may further specify a minimum pitch distance, L, between the center of a via and the center of a back-drilled hole. The available distance, d, for separating a back-drilled via and a contact pad, may be determined based on this formula:

$$d = L - \frac{(D_P + D_B)}{2}. \quad (3)$$

In general, the available distance, d, needs to be greater than or equal to $d_{min}$. As an example, assuming the values for L, $D_F$, $D_B$, and $d_{min}$ are 31.5 mil, 27 mil, 16 mil, and 8 mil, respectively. The available distance, d, for separating a back-drilled via and a contact pad would be 10 mil, which is greater than the minimum back-drill-to-element distance, $d_{min}$ of 8 mil. Without dual-drill vias, e.g., one-size through-hole vias only, the diameter of the back-drilled hole would need to increase because the diameter of the back-drill bit would need to be larger than the diameter of a through-hole via, i.e., the diameter of the wide cylindrical opening in order to remove the via stub, i.e., the via portion which is not in the propagating signal path. As an example, with a one-size through-hole vias configuration, $D_B$ may need to be increased from 16 mil to 28 mil. The available distance, d, for separating a back-drilled via and a contact pad would be 4 mil, which is smaller than the minimum back-drill-to-element distance, $d_{min}$, of 8 mil. Dual-drill vias therefore enable a denser placement of elements on a PCB layer.

Figure 5:
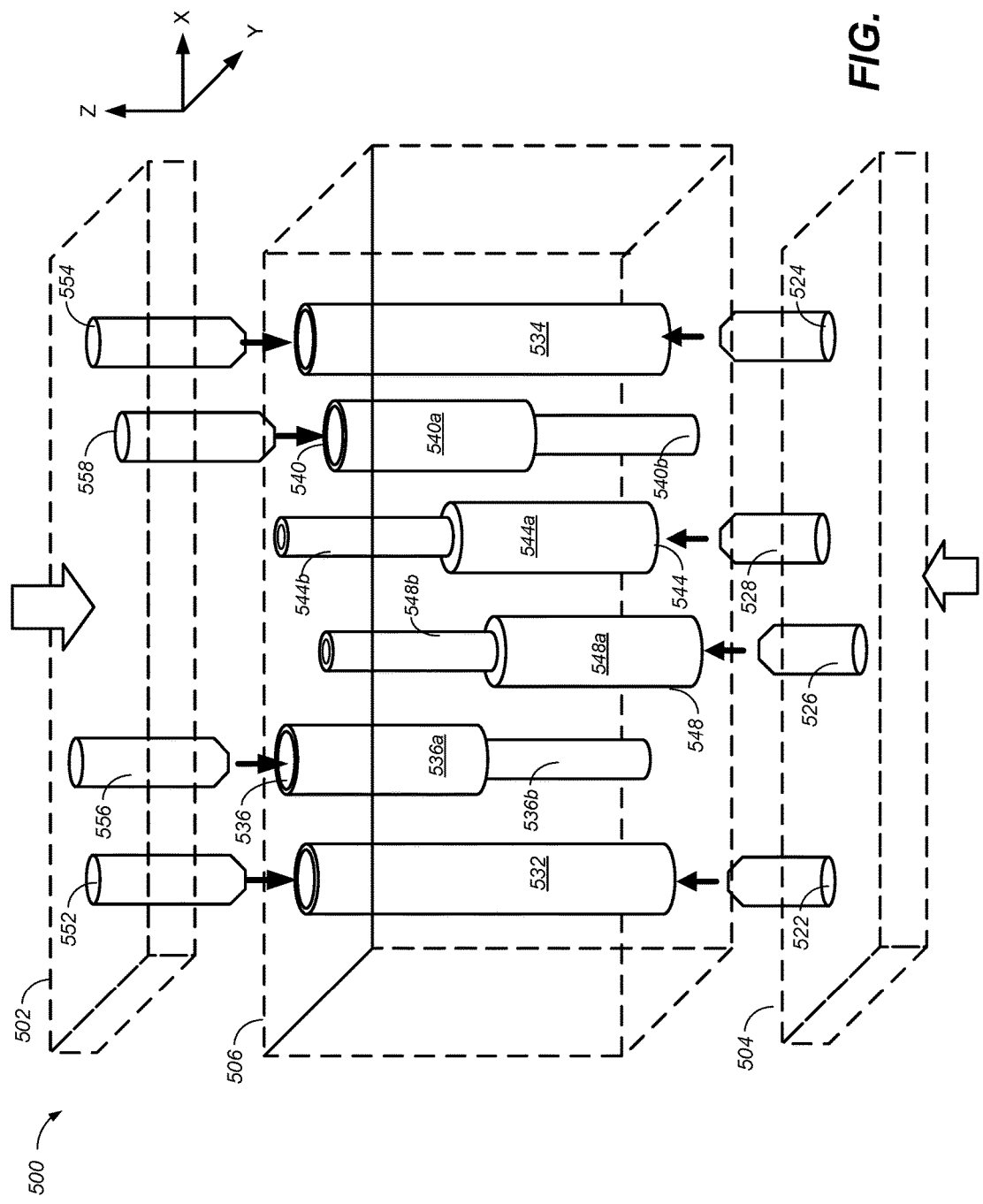
FIG. 5 illustrates another example printed circuit board having dual-drill vias for a belly-to-belly assembly.

FIG. 5 is an example assembly 500 that includes a PCB 506, a first component 502, and a second component 504. The first component 502 includes pins 552, 554, 556, and 558 for establishing electrical connections with the PCB 506. The second component 504 includes pins 522, 524, 526, and 528 for establishing electrical connections with the PCB 506. The PCB 506 includes vias 532, 534, 536, 540, 544, and 548. The via 536 includes a wide cylindrical opening 536a and a narrow cylindrical opening 536b, where the two cylindrical openings 536a and 536b are electrically connected. The via 548 includes a wide cylindrical opening 548a and a narrow cylindrical opening 548b, where the two cylindrical openings 548a and 548b are electrically connected. The via 544 includes a wide cylindrical opening 544a and a narrow cylindrical opening 544b that are electrically connected to each other. The via 540 includes a wide cylindrical opening 540a and a narrow cylindrical opening 540b that are electrically connected to each other. In general, the assembly 500 is similar to the assembly 100 as described in reference to FIG. 1A and FIG. 1B. However, no back-drilled holes are formed in the PCB 506. In some implementations, back-drilled holes may not be needed if the signal integrity of the data signal being transmitted over dual-drill vias 536, 540, 544, and 548 satisfies a threshold condition. For example, back-drilled holes may not be needed if the bit-error rate of the data signal being transmitted over dual-drill vias 536, 540, 544, and 548 is below a threshold value (e.g., $10^{-18}$). In other words, if the via stub is relatively short comparing to the wavelength of the Nyquist frequency of the high speed signals propagating on the path, the back-drill process for removing the via stub may not be needed.

Figure 6:
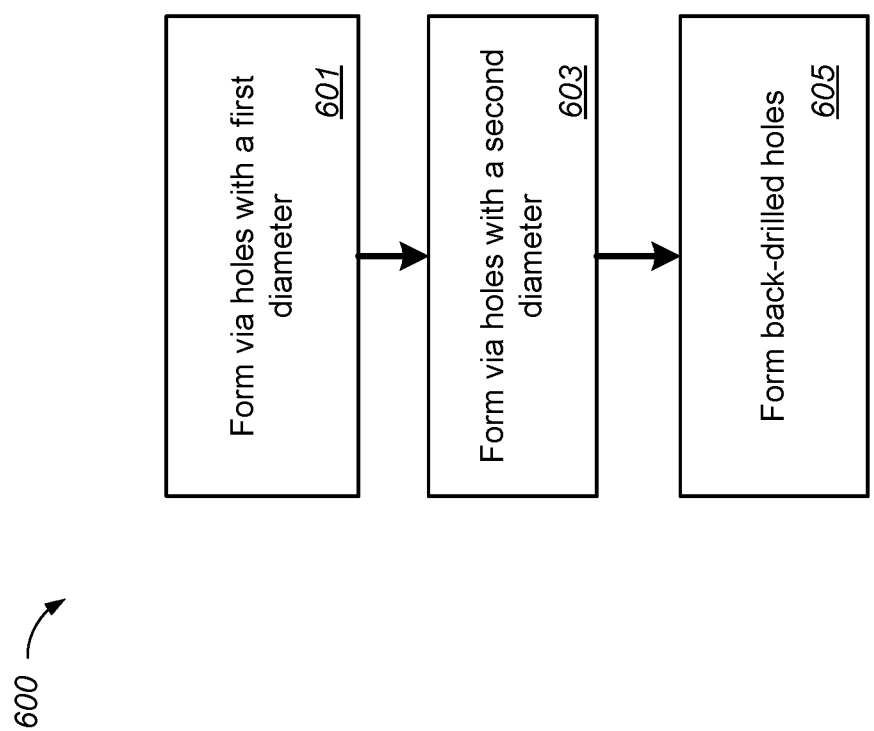
FIG. 6 is a flowchart of an example process for forming dual-drill vias on a printed circuit board.

FIG. 6 is a flowchart of an example process 600 for forming dual-drill vias. The process 600 may be performed by a system such as an automated via-drilling equipment or any suitable equipment. The system forms via holes with a first diameter (601). For example, referring to FIG. 1B, the system may drill, in a direction from the surface 106a to the surface 106b, a wide cylindrical opening 136a having a designed via depth. The system may also drill, in a direction from the surface 106b to the surface 106a, a first cylindrical opening 144a having a designed via depth.

The system forms via holes with a second diameter (603). For example, referring to FIG. 1B, after the wide cylindrical opening 136a is formed, the system may drill, in a direction from the surface 106b to the surface 106a, a narrow cylindrical opening 136b having a designed via depth to form the dual-drill via 136. The system may also drill, in a direction from the surface 106a to the surface 106b, a wide cylindrical opening 144b having a designed via depth to form the dual-drill via 144. After the two via holes are formed, a conductive film is deposited on the surfaces of vias holes to form dual-drill vias.

In some implementations, if an aspect ratio between a thickness of a PCB and the second diameter satisfies a threshold value, e.g., less than a threshold value, the system may form vias with the second diameter before forming vias with the first diameter. For example, referring to FIG. 1B, the PCB 106 may be sufficiently thin for through-holes with the second diameters to be formed in the PCB 106. Before the wide cylindrical opening 136a is formed, the system may drill, in a direction from the surface 106a to the surface 106b, or from the surface 106b to the surface 106a, a through-hole having the second diameter. The system may then drill, in a direction from the surface 106a to the surface 106b, a wide cylindrical opening 136a having a designed via depth to form the dual-drill via 136.

In some implementations, the system may form back-drilled holes with a third diameter (605). For example, referring to FIG. 1B, after the dual-drill via 136 is formed, the system may drill, in a direction from the surface 106b to the surface 106a, a back-drilled hole 138 having a designed via depth. The system may also drill, in a direction from the surface 106a to the surface 106b, a back-drilled hole 146 having a designed via depth. The diameter of the drill bit for drilling the back-drilled holes is larger than the diameter of the narrow cylindrical opening 136b. In some implementations, the diameter of the drill bit for drilling the back-drilled holes may be smaller than the diameter of the wide cylindrical opening 136a.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. Various implementations may have been discussed using two-dimensional cross-sections for easy description and illustration purpose. Nevertheless, the three-dimensional variations and derivations should also be included within the scope of the disclosure.

Similarly, while operations are depicted in the drawings in a particular order, this should not be understood as requiring that such operations be performed in the particular order shown or in sequential order, or that all illustrated operations be performed, to achieve desirable results.

Thus, particular embodiments have been described. Other embodiments are within the scope of the following claims. For example, the actions recited in the claims may be performed in a different order and still achieve desirable results.

What is claimed is:

1. A printed circuit board having multiple layers of circuitry, the printed circuit board comprising:
   a first layer having a first cylindrical opening with a first diameter, the first cylindrical opening formed through at least the first layer and formed about a particular axis;
   a second layer having a second cylindrical opening with a second diameter, the second cylindrical opening formed through at least the second layer and formed about the particular axis,
   wherein the first cylindrical opening is a portion of a conductive via, and
   wherein the second diameter is smaller than the first diameter; and a third layer having a third cylindrical opening with a third diameter, the third cylindrical opening formed through at least the third layer and formed about the particular axis, wherein the third layer is arranged between the first layer and the second layer, wherein the third diameter is smaller than the second diameter, wherein the third cylindrical opening is a portion of the conductive via, and wherein the second cylindrical opening is non-conductive.

2. An apparatus comprising:
a printed circuit board having multiple layers of circuitry, the printed circuit board comprising:
  a first layer having a first cylindrical opening with a first diameter, the first cylindrical opening formed through at least the first layer and formed about a particular axis; and
  a second layer having a second cylindrical opening with a second diameter, the second cylindrical opening formed through at least the second layer and formed about the particular axis,
  wherein the first cylindrical opening is a portion of a conductive via, and
  wherein the second diameter is smaller than the first diameter;
a first component having multiple pins, wherein a first pin of the multiple pins is connected to the conductive via; and
a second component having multiple pins,
  wherein the printed circuit board is arranged between the first component and the second component,
  wherein the first layer of the printed circuit board has a third cylindrical opening with the second diameter, the third cylindrical opening formed through at least the first layer and formed about a different axis that is parallel to the particular axis,
  wherein the second layer of the printed circuit board has a fourth cylindrical opening with the first diameter, the fourth cylindrical opening formed through at least the second layer and formed about the different axis,
  wherein the fourth cylindrical opening is a portion of a different conductive via of the printed circuit board, and
  wherein a first pin of the multiple pins of the second component is connected to the different conductive via.

3. The printed circuit board of claim 1, wherein the second cylindrical opening is a portion of the conductive via.

4. The printed circuit board of claim 1,
wherein the first layer has a third cylindrical opening with the second diameter, the third cylindrical opening formed through at least the first layer and formed about a different axis that is parallel to the particular axis,
wherein the second layer has a fourth cylindrical opening with the first diameter, the fourth cylindrical opening formed through at least the second layer and formed about the different axis, and
wherein the fourth cylindrical opening is a portion of a different conductive via.

5. The printed circuit board of claim 4,
wherein the first layer includes a pair of conductive traces, and
wherein a first conductive trace of the pair of conductive traces is electrically coupled to the conductive via.

6. The printed circuit board of claim 5,
wherein the second layer includes a different pair of conductive traces, and
wherein a first conductive trace of the different pair of conductive traces is electrically coupled to the different conductive via.

7. The printed circuit board of claim 4, wherein the third cylindrical opening is a portion of the different conductive via.

8. The printed circuit board of claim 4, further comprising:
a third layer having a fifth cylindrical opening with a third diameter, the fifth cylindrical opening formed through at least the third layer and formed about the particular axis; and
a fourth layer having a sixth cylindrical opening with the third diameter, the sixth cylindrical opening formed through at least the fourth layer and formed about the different axis,
wherein the third layer and the fourth layer are arranged between the first layer and the second layer,
wherein the third diameter is smaller than the second diameter,
wherein the fifth cylindrical opening is a portion of the conductive via,
wherein the sixth cylindrical opening is a portion of the different conductive via, and
wherein the second cylindrical opening and the third cylindrical opening are non-conductive.

9. The printed circuit board of claim 1,
wherein the first layer and the second layer have a third cylindrical opening with the first diameter, the third cylindrical opening formed through at least the first layer and the second layer formed about a different axis that is parallel to the particular axis, and
wherein the third cylindrical opening is a portion of a ground via coupled to a ground voltage.

10. The apparatus of claim 2,
wherein the first layer includes a pair of conductive traces, and
wherein a first conductive trace of the pair of conductive traces is electrically coupled to the conductive via.

11. The apparatus of claim 10,
wherein the second layer includes a different pair of conductive traces, and
wherein a first conductive trace of the different pair of conductive traces is electrically coupled to the different conductive via.

12. The apparatus of claim 2, wherein the first component is a transmitter module for transmitting data and the second component is a receiver module for receiving data.

13. The apparatus of claim 2,
wherein the first layer and the second layer have a third cylindrical opening with the first diameter, the third cylindrical opening being a portion of a ground via that is coupled to a ground voltage, and
wherein a second pin of the multiple pins of the first component is connected to the ground via through the first layer, and
wherein a second pin of the multiple pins of the second component is connected to the ground via through the second layer.

14. The apparatus of claim 2, wherein the printed circuit board further comprises:

a third layer having a fifth cylindrical opening with a third diameter, the fifth cylindrical opening formed through at least the third layer and formed about the particular axis; and a fourth layer having a sixth cylindrical opening with the third diameter, the sixth cylindrical opening formed through at least the fourth layer and formed about the different axis, wherein the third layer and the fourth layer are arranged between the first layer and the second layer, wherein the third diameter is smaller than the second diameter, wherein the fifth cylindrical opening is a portion of the conductive via, wherein the sixth cylindrical opening is a portion of the different conductive via, and wherein the second cylindrical opening and the third cylindrical opening are non-conductive.

15. The apparatus of claim 2, wherein the second cylindrical opening is a portion of the conductive via, and wherein the third cylindrical opening is a portion of the different conductive via.

* * * * *